United States Patent
Lee et al.

(10) Patent No.: US 9,728,587 B2
(45) Date of Patent: Aug. 8, 2017

(54) ORGANIC LIGHT EMITTING DIODE DEVICE WITH A COLOR CALIBRATION LAYER

(75) Inventors: Sung-Hun Lee, Yongin (KR); Jung-Bae Song, Yongin (KR); Gwan-Hyoung Lee, Yongin (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 100 days.

(21) Appl. No.: 12/958,324

(22) Filed: Dec. 1, 2010

(65) Prior Publication Data

US 2011/0134019 A1    Jun. 9, 2011

(30) Foreign Application Priority Data

Dec. 4, 2009   (KR) .................. 10-2009-0120028

(51) Int. Cl.
| | | |
|---|---|---|
| *H01L 27/32* | (2006.01) | |
| *H01L 51/50* | (2006.01) | |
| *H01L 51/52* | (2006.01) | |

(52) U.S. Cl.
CPC ........ *H01L 27/3213* (2013.01); *H01L 27/322* (2013.01); *H01L 27/3209* (2013.01); *H01L 27/3244* (2013.01); *H01L 51/5036* (2013.01); *H01L 51/5284* (2013.01)

(58) Field of Classification Search
CPC ..... G09G 2320/0233; G09G 2320/062; G09G 2320/0693; H01L 27/3213; H01L 27/322; H01L 27/3209; H01L 27/3244; H01L 51/5284; H01L 51/5036
USPC ...................................................... 345/76–83
See application file for complete search history.

(56) References Cited

U.S. PATENT DOCUMENTS

| | | | |
|---|---|---|---|
| 6,919,681 B2 | 7/2005 | Cok et al. | |
| 2004/0206960 A1 | 10/2004 | Nishikawa | |
| 2005/0206305 A1 | 9/2005 | Masuda et al. | |
| 2005/0218768 A1 | 10/2005 | Saito | |
| 2005/0258429 A1 | 11/2005 | Cok et al. | |
| 2006/0187155 A1* | 8/2006 | Chang | G09G 3/3208 345/76 |
| 2006/0238120 A1* | 10/2006 | Miller | C09K 11/06 313/506 |
| 2007/0090751 A1* | 4/2007 | Cok et al. | 313/501 |
| 2008/0218067 A1 | 9/2008 | Lee et al. | |
| 2009/0051275 A1 | 2/2009 | Kobayashi et al. | |

(Continued)

FOREIGN PATENT DOCUMENTS

| | | |
|---|---|---|
| CN | 1535096 | 10/2004 |
| CN | 1671262 | 9/2005 |

(Continued)

*Primary Examiner* — Lisa Landis
(74) *Attorney, Agent, or Firm* — Knobbe Martens Olson & Bear LLP

(57) ABSTRACT

An organic light emitting diode device is disclosed. The organic light emitting diode device includes a color calibration layer which is applied to the white sub-pixel. The color calibration layer selectively absorbs light in a given wavelength region thereby increasing luminance due to the white sub-pixel while simultaneously preventing the deformation of white color coordination. The contrast ratio may also be improved by reducing the reflection of external light, thereby minimizing the need for a polarizer, and the thickness of the device may thus be decreased and processing costs may be reduced.

15 Claims, 11 Drawing Sheets

(56) References Cited

U.S. PATENT DOCUMENTS

| | | | |
|---|---|---|---|
| 2009/0072693 A1* | 3/2009 | Cok | H01L 27/3213 313/110 |
| 2010/0006845 A1* | 1/2010 | Seo | H01L 27/1214 257/59 |
| 2010/0053038 A1* | 3/2010 | Sakamoto | 345/76 |
| 2010/0096633 A1* | 4/2010 | Hatano | H01L 27/1214 257/59 |
| 2010/0159792 A1* | 6/2010 | Visser | H01L 51/5234 445/58 |
| 2011/0074272 A1* | 3/2011 | Sakamoto et al. | 313/113 |

FOREIGN PATENT DOCUMENTS

| | | |
|---|---|---|
| CN | 1678154 | 10/2005 |
| CN | 1815750 | 8/2006 |
| CN | 101262724 | 9/2008 |
| CN | 101533850 | 9/2009 |
| JP | 2003-272860 | 9/2003 |
| JP | 2004-335467 | 11/2004 |
| JP | 2005-317507 | 11/2005 |
| JP | 2006-127987 A | 5/2006 |
| JP | 2006-324016 | 11/2006 |
| JP | 2007-103028 | 4/2007 |
| JP | 2007-149693 | 6/2007 |
| JP | 2007-234268 | 9/2007 |
| JP | 2007-537577 | 12/2007 |
| JP | 2008-218366 | 9/2008 |
| JP | 2009-048892 | 3/2009 |
| KR | 10-2007-0121091 A | 12/2007 |
| KR | 1020080011829 | 2/2008 |

\* cited by examiner

FIG. 1

| B | W | B | W | B |
|---|---|---|---|---|
| G | R | G | R | G |
| B | W | B | W | B |
| G | R | G | R | G |
| B | W | B | W | B |

ORGANIC LIGHT EMITTING DIODE DEVICE WITH A COLOR CALIBRATION LAYER

CROSS-REFERENCE TO RELATED APPLICATIONS

This application claims priority to and the benefit of Korean Patent Application No. 10-2009-0120028 filed in the Korean Intellectual Property Office on Dec. 4, 2009, the entire contents of which are incorporated herein by reference.

BACKGROUND

Field

Embodiments relate to an organic light emitting diode device.

Description of the Related Technology

Cathode ray tubes (CRT) have been substituted with liquid crystal displays (LCD), providing light and slim monitors.

Liquid crystal displays (LCD) are non-emissive devices requiring a separate backlight, and have limitations on their response speed, viewing angle and the like.

Organic light emitting diode (OLED) devices have recently drawn attention and may address some of the limitations of LCDs.

An organic light emitting diode device generally includes two electrodes, and an emission layer interposed therebetween, with electrons injected from one electrode, holes injected from the other electrode, and the electrons and holes combined in the emission layer to generate excitons which release energy and emit light.

Since the organic light emitting diode device emits light without an additional light source, it has low power consumption, better response speed, viewing angles, and contrast ratio.

An organic light emitting diode device generally includes a plurality of pixels. Each pixel includes a plurality of sub-pixels, such as a red sub-pixel, a blue sub-pixel, and a green sub-pixel, or the like, and expresses full color by combining these sub-pixels.

Each of the red sub-pixel, the blue sub-pixel, and the green sub-pixel includes a red emission layer, a blue emission layer, and a green emission layer, respectively, to express color. The emission layer may be deposited in each sub-pixel with a fine shadow mask. However, as the display device becomes larger, it may be difficult to deposit the emission layer in each sub-pixel using such a fine shadow mask.

Accordingly, it has been suggested that the red emission layer, the blue emission layer, and the green emission layer be sequentially stacked in the entire display device using an open mask to emit white light, and then a color filter be disposed where the emitted light is passed to respectively express red, green, and blue in each sub-pixel. However, when the white emitting light is passed through the color filter, the light transmittance may be deteriorated due to the absorption of light by the color filter.

SUMMARY OF CERTAIN INVENTIVE ASPECTS

One aspect is an organic light emitting diode device. The device includes a first sub-pixel, a second sub-pixel, and a third sub-pixel, each sub-pixel displaying a different color. The device also includes a white sub-pixel, where the white sub-pixel includes a color calibration layer which selectively absorbs light of at least one predetermined wavelength region, where the predetermined wavelength region includes visible rays.

Another aspect is an organic light emitting diode device. The device includes a red sub-pixel including a red color filter, a green sub-pixel including a green color filter, a blue sub-pixel including a blue color filter and a white sub-pixel including a color calibration layer which selectively absorbs light of at least one predetermined wavelength region among red, blue and green wavelength regions. Each of the sub-pixels includes a first electrode and a second electrode facing each other, and an emission layer interposed between the first electrode and the second electrode, where the emission layer is disposed across the red, green, blue and white sub-pixels, and includes a plurality of sub-emission layers in a stacked structure, where each sub-emission layer emits light of a different wavelength. The emission layer also includes a charge-generation layer, where the emission layer emits white light by combining the lights of different wavelengths emitted from the sub-emission layers.

Another aspect is an organic light emitting diode device. The device includes a plurality of sub-pixels including a red sub-pixel, a green sub-pixel, a blue sub-pixel and a white sub-pixel. The device also includes a lower layer including a red color filter disposed in the red sub-pixel, a green color filter disposed in the green sub-pixel, a blue color filter disposed in the blue sub-pixel, at least one light blocker, and a color calibration layer disposed in the white sub-pixel. The color calibration layer selectively absorbs light of at least one predetermined wavelength region among red, blue and green wavelength regions, an upper layer including a plurality of pixel electrodes and a plurality of insulators, an organic emission layer.

BRIEF DESCRIPTION OF THE DRAWINGS

FIG. 1 is a top plan view of an arrangement of a plurality of pixels in an organic light emitting diode device according to an exemplary embodiment.

DETAILED DESCRIPTION OF CERTAIN INVENTIVE EMBODIMENTS

Figure 2:
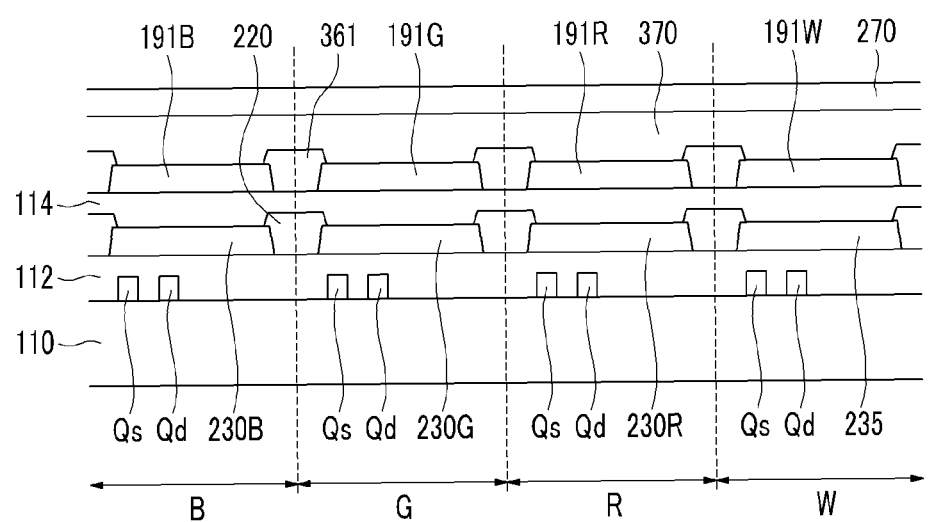
FIG. 2 is a cross-sectional view of a structure of an organic light emitting diode device according to an exemplary embodiment.

This disclosure will be described more fully hereinafter with reference to the accompanying drawings, in which exemplary embodiments are shown. As those skilled in the art would realize, the described embodiments may be modified in various ways, without departing from the spirit or scope of this disclosure.

In the drawings, the thickness of layers, films, panels, regions, etc., are magnified for clarity. Like reference numerals generally designate like elements throughout the specification. It will be understood that when an element such as a layer, film, region, or substrate is referred to as being "on" another element, it can be directly on the other element, or intervening elements may also be present.

Figure 1:
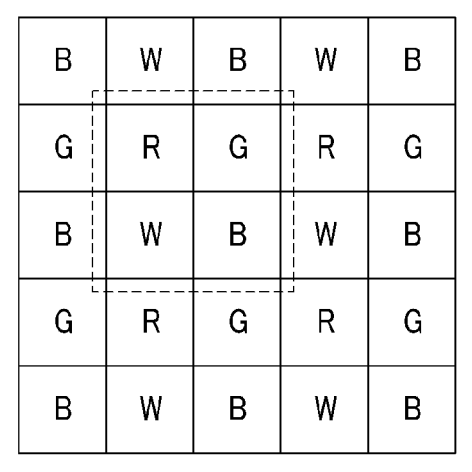

Hereinafter, an organic light emitting diode device according to an exemplary embodiment is described with reference to FIG. 1 and FIG. 2.

FIG. 1 is a top plan view of an arrangement of a plurality of pixels in an organic light emitting diode device according to an exemplary embodiment; FIG. 2 is a cross-sectional view of a structure of an organic light emitting diode device according to an exemplary embodiment.

As illustrated in FIG. 1, a red sub-pixel (R) expressing red, a green sub-pixel (G) expressing green, a blue sub-pixel (B) expressing blue, and a white sub-pixel (W) expressing no color are alternately arranged in the organic light emitting diode device according to an exemplary embodiment.

Red sub-pixel (R), green sub-pixel (G), and blue sub-pixel (B) are primary pixels for expressing full color. White sub-pixel (W) may be used to increase the light transmission and thereby enhance the luminance of the device.

Four pixels, comprising the red sub-pixel (R), the green sub-pixel (G), the blue sub-pixel (B), and the white sub-pixel (W) may form one group and be repeated along a row and/or a column. Alternative arrangements of pixels may also be used.

A structure of an organic light emitting diode device including red sub-pixel (R), green sub-pixel (G), blue sub-pixel (B), and white sub-pixel (W) is described with reference to FIG. 2.

A plurality of thin film transistor arrays are arranged on an insulation substrate 110. A thin film transistor array includes a switching thin film transistor, Qs, and a driving thin film transistor, Qd, which are disposed in each sub-pixel B, G, R and W, and are electrically connected with each other. Although one switching thin film transistor, Qs, and one driving thin film transistor, Qd, are exemplarily illustrated in each sub-pixel of the embodiment in FIG. 2, a plurality of one or both transistors may be included in each sub-pixel in alternative embodiments.

A lower insulation layer 112 is disposed on the thin film transistor array. On the lower insulation layer 112, a plurality of contact holes (not shown) are formed for partially exposing the switching thin film transistor Qs and the driving thin film transistor Qd.

On the lower insulation layer 112, a blue color filter 230B is disposed in the blue sub-pixel (B), a green color filter 230G is disposed in the green sub-pixel (G), and a red color filter 230R is disposed in the red sub-pixel (R), and. The color filters 230B, 230G, and 230R may be disposed according to a color filter on array (CoA) manner.

A color calibration layer 235 is disposed in the white sub-pixel (W). In FIG. 2, the color calibration layer 235 is disposed at the same layer as the color filters 230B, 230G, and 230R but alternative arrangements are also possible.

The color calibration layer 235 may selectively absorb at least one part of light of a predetermined wavelength region among the visible ray region. For example, it may selectively absorb light of at least one of a red wavelength region, a green wavelength region, and a blue wavelength region.

The color calibration layer 235 will be described hereinafter.

A light blocker 220, is disposed between the blue color filter 230B and the green color filter 230G, between the green color filter 230G and the red color filter 230R, and between the red color filter 230R and the color calibration layer 235. Each of the light blockers, 220, may block light leakage between the sub-pixels B, G, R and W.

An upper insulation layer 114 is disposed on the blue color filter 230B, the green color filter 230G, the red color filter 230R, the color calibration layer 235, and the light blocker 220. A plurality of contact holes (not shown) are formed in the upper insulation layer 114.

Pixel electrodes (191B, 191G, 191R, 191W) are disposed on the upper insulation layer 114. The pixel electrodes (191B, 191G, 191R, 191W) are electrically connected to the driving thin film transistor, Qd, through contact holes (not shown) and the pixel electrodes may act as anodes.

A plurality of insulators 361 are disposed, each between adjacent pixel electrodes (191B, 191G, 191R, 191W) for defining each sub-pixel, and an organic light emitter 370 is disposed on the pixel electrode (191R, 191G, 191B, 191W) and the insulator 361.

An organic light emitter 370 is disposed across the blue sub-pixel (B), the green sub-pixel (G), the red sub-pixel (R) and the white sub-pixel (W), and the organic light emitter 370 may include an organic emission layer for emitting light and an auxiliary layer for improving the luminous efficiency of the organic emission layer.

The organic emission layer may emit white light by substantially stacking light emitting materials inherently emitting blue, green, and red lights to provide a plurality of sub-emission layers (not shown) and combining these colors. The sub-emission layer may be vertically formed, or horizontally formed, and may combine various colors other than blue, green, and red, as long as the colors can emit white light. The light emitting material may include a fluorescent or phosphorescent material.

The auxiliary layer may comprise least one of an electron transport layer (ETL), a hole transport layer (HTL), an electron injection layer (EIL), and a hole injection layer (HIL).

Figure 3A:
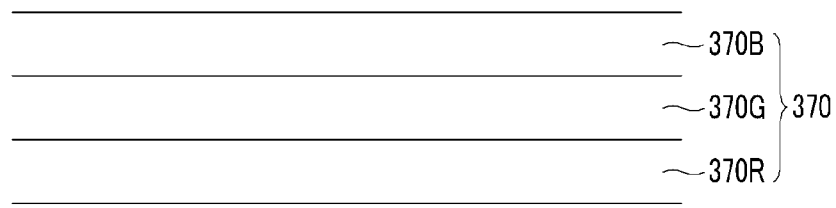
FIG. 3A and FIG. 3B are cross-sectional views of a stacking structure of an organic light emitter according to an exemplary embodiment.
Figure 3B:
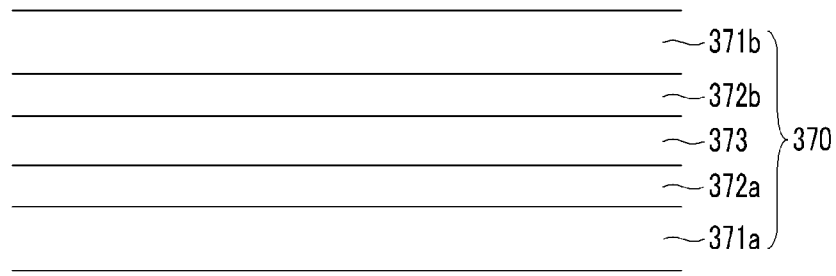

FIG. 3A and FIG. 3B are cross-sectional views of a stacking structure of an organic light emitter according to an exemplary embodiment.

As shown in FIG. 3A, the organic light emitter 370, may comprise a red emission layer 370R, a green emission layer 370G, and a blue emission layer 370B, vertically stacked.

As shown in FIG. 3B, the organic light emitter 370 may include a lower auxiliary layer 371a, a lower emission layer 372a, a charge-generation layer 373, an upper emission layer 372b, and an upper auxiliary layer 371b.

Each of the lower auxiliary layer 371a and the upper auxiliary layer 371b may include at least one of a hole injection layer (HIL), a hole transport layer (HTL), an electron transport layer (ETL), and an electron injection layer (EIL).

The lower emission layer 372a and the upper emission layer 372b may each be selected from a red emission layer, a green emission layer, and a blue emission layer, The combination of the lower emission layer 372a and the upper emission layer 372b emits white light by combining the lights emitted from the lower emission layer 372a and the upper emission layer 372b.

The charge-generation layer 373 generates a plurality of electron-hole pairs. For example, electrons may be transported to the lower emission layer 372a and holes may be transported to the upper emission layer 372b. The current efficiency may be increased by providing a charge-generation layer 373 between two emission layers 372a and 372b, thereby improving life-span of a device.

Returning to FIG. 2, a common electrode 270 is disposed on the organic light emitter 370. The common electrode 270 may be formed across the entire surface of the substrate 110, and may be a cathode. The common electrode 270 is paired with pixel electrodes (191B, 191G, 191R, 191W) to flow current into the organic light emitter 370.

As described above, the organic light emitting diode device according to an exemplary embodiment-includes a red sub-pixel (R), a green sub-pixel (G), and a blue sub-pixel (B) for displaying different colors and a white sub-pixel (W) for improving luminance. An organic light emitter, comprising a plurality of emission layers, emits white light by combining lights of different wavelengths and is disposed on the entire surface of the substrate. The red sub-pixel (R), the green sub-pixel (G), and the blue sub-pixel (B) include color filters 230R, 230G, and 230B, respectively. The white light emitted from the organic light emitter is passed through each color filter 230R, 230G, and 230B to display color.

Since the light emitted from white sub-pixel (W) is emitted without passing through a separate color filter, it has a higher light transmittance compared to the sub-pixels displaying color. Accordingly, the overall luminance of the organic light emitting diode device may be enhanced.

Generally, the light emitted from the white sub-pixel (W) may be different from the white color coordination required for each organic light emitting diode device. When the white light emitted from the white sub-pixel has the different color coordination from the white light practically required for the organic light emitting diode device, the white color may be expressed by combining lights emitted from the red sub-pixel, the green sub-pixel, and the blue sub-pixel as well as the white sub-pixel. In other words, the color coordination required for white color is achieved by combining light emitted from the red sub-pixel, the green sub-pixel, the blue sub-pixel, and the white sub-pixel.

In existing devices, in order to display the color required for an organic light emitting diode device, all the sub-pixels are used, thereby increasing power consumption.

According to an exemplary embodiment, a color calibration layer 235 is provided in the white sub-pixel (W), thereby improving power consumption by using only the white sub-pixel, or by combining minimum lights of red sub-pixel, green sub-pixel and blue sub-pixel to display white color.

The color calibration layer 235 may selectively absorb the light of at least one wavelength region within the visible ray region. For example, it may absorb the light of at least one wavelength region among red wavelength region, green wavelength region, and blue wavelength region.

Although the color filters 230B, 230G, and 230R and color calibration layer 235 are disposed under the emission layer 370 in the embodiment shown in FIG. 2, in other embodiments, the color filters 230B, 230G, and 230R and color calibration layer 235 may be disposed above the emission layer 370.

FIG. 4A to FIG. 4D are graphs illustrating light transmittance of a color calibration layer in an organic light emitting diode device according to an exemplary embodiment.

Figure 4A:
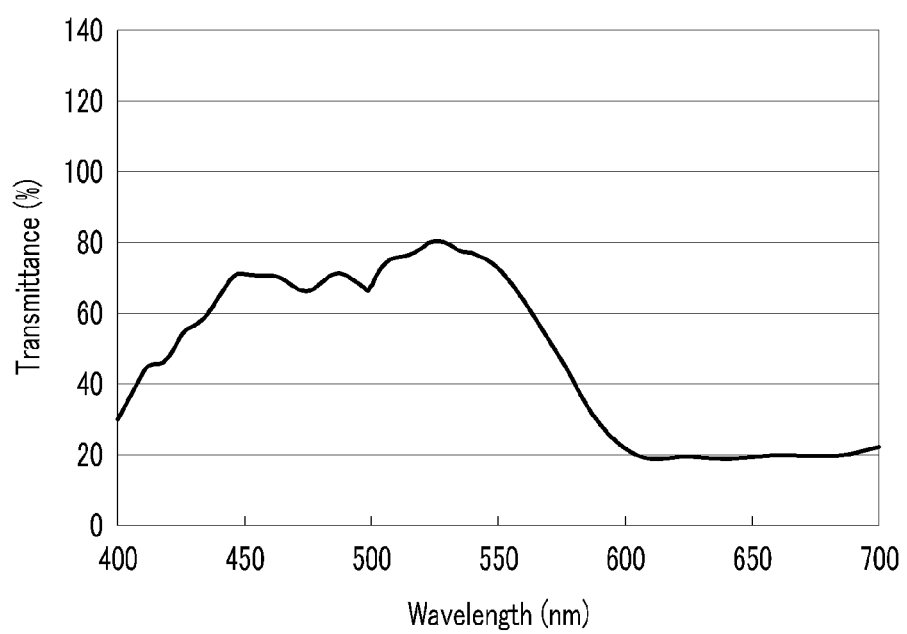
FIG. 4A to FIG. 4D are graphs illustrating light transmittance of a color calibration layer in an organic light emitting diode device according to an exemplary embodiment.
Figure 4B:
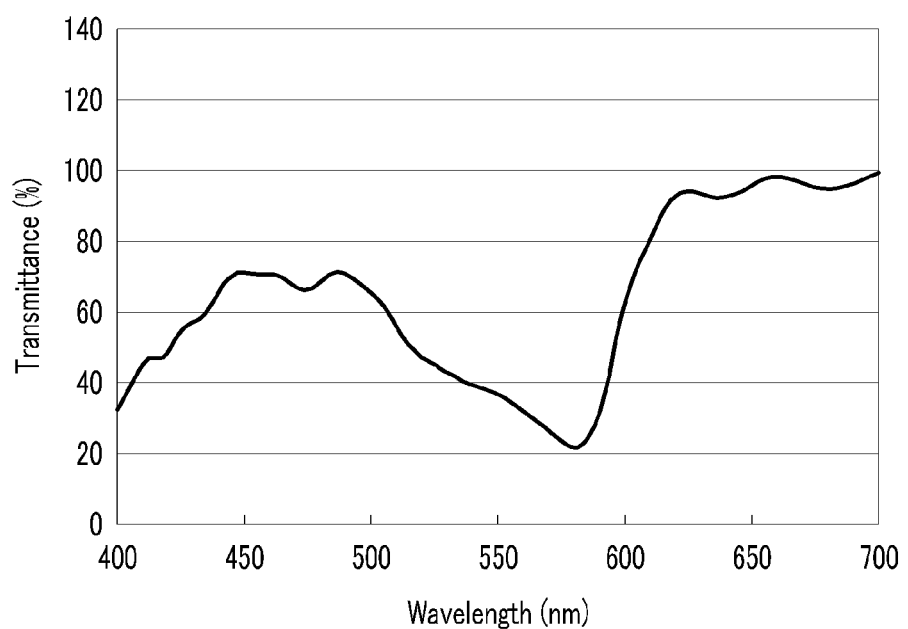
Figure 4C:
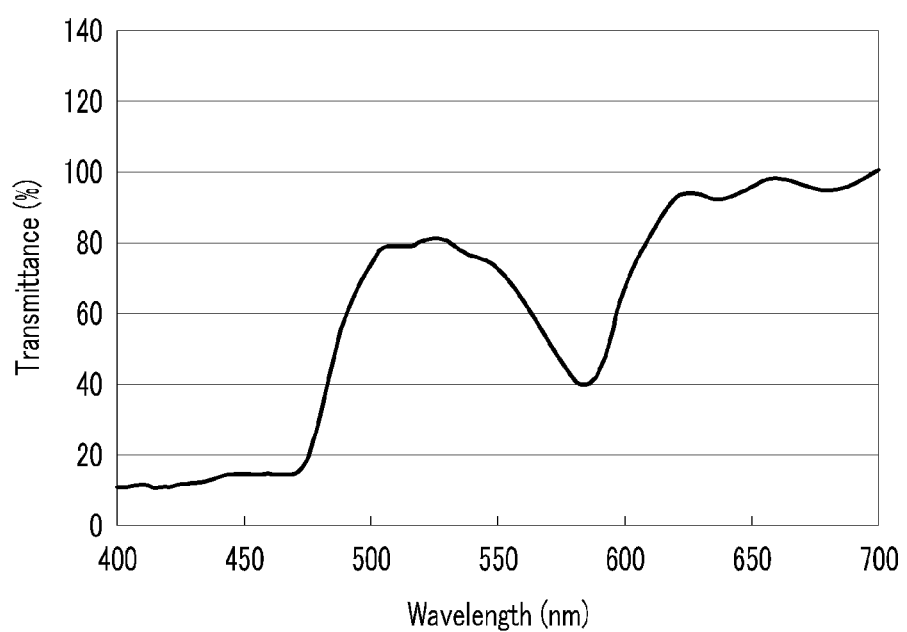
Figure 4D:
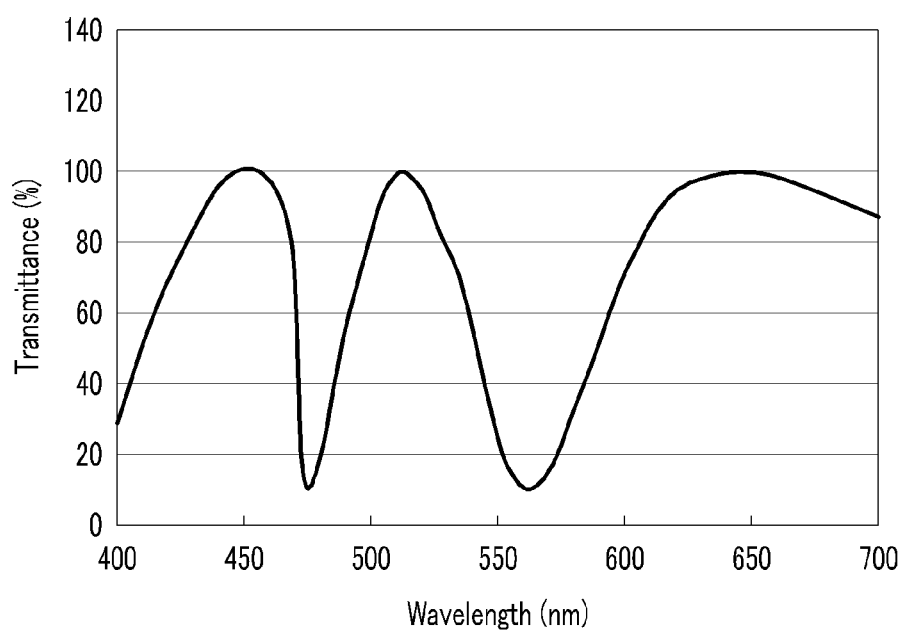

As shown in the graph of FIG. 4A, the color calibration layer 235 may selectively absorb the light of red wavelength region (long wavelength region) among the visible ray region, where the transmittance is shown to be reduced to about 20%. Similarly, as shown in the graph of FIG. 4B, the color calibration layer 235 may selectively absorb the light of green wavelength region (medium wavelength region) As shown in the graph of FIG. 4C, the color calibration layer 235 may selectively absorb the light of blue wavelength region (short wavelength region) and the light of the green wavelength region (medium wavelength region). As shown in FIG. 4D, the color calibration layer 235 may selectively absorb the light of green wavelength region near to blue wavelength region and the light of green wavelength region near to red wavelength region. In other embodiments, the color calibration layer 235 may selectively absorb the light of at least one region among the visible wavelength region.

The use of a color calibration layer 235 which selectively absorbs light of a given wavelength region on the white sub-pixel (W) may help increase luminance due to the white sub-pixel (W) while simultaneously preventing the deformation of white color coordination.

It is thus possible to display the color close to the required white, thereby improving the color characteristic. Additionally, the light efficiency and the power consumption may be improved since color deformation calibration is minimized. Finally, the contrast ratio may be improved by reducing the reflection of external light, thereby minimizing the need for a polarizer, the thickness of the device may be decreased and processing costs may be reduced.

Figure 5A:
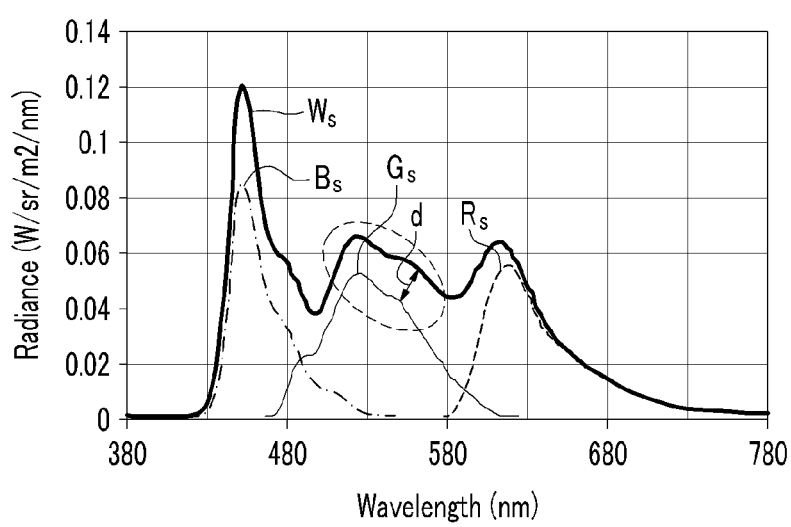
FIG. 5A is a graph illustrating luminance and color characteristics when a color calibration layer is not applied to the white sub-pixel.
Figure 5B:
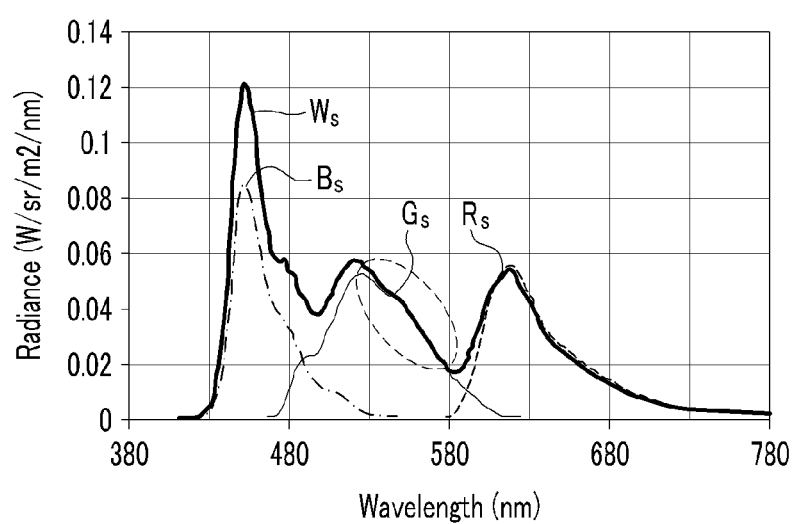
FIG. 5B is a graph illustrating luminance and color characteristics when a color calibration layer absorbing light of a green wavelength region is applied to the white sub-pixel, according to an exemplary embodiment.

Referring to FIG. 5A and FIG. 5B, as well as Table 1 below, the luminance and current characteristics are illustrated when the color calibration layer is applied in the organic light emitting diode device according to an exemplary embodiment.

FIG. 5A is a graph illustrating luminance and color characteristics when a color calibration layer is not applied to the white sub-pixel. FIG. 5B is a graph illustrating luminance and color characteristics when a color calibration layer absorbing light of a green wavelength region is applied to the white sub-pixel, according to an exemplary embodiment.

In FIG. 5A and FIG. 5B, Rs refers to light spectrum of light passed through a red color filter, Gs refers to light spectrum of light passed through a green color filter, and Bs refers to light spectrum of light passed through a blue color filter. Ws refers to the light spectrum of white light. The exemplary embodiment of an organic light emitting diode device described requires a white color coordinate of (0.28, 0.29).

Table 1 shows each of the color coordinates of red, green, and blue and white measured in an exemplary embodiment of an organic light emitting diode device as illustrated in FIG. 5A and FIG. 5B.

TABLE 1

| | color calibration layer | Cx | Cy |
|---|---|---|---|
| white sub-pixel | not used | 0.316 | 0.330 |
| | used | 0.286 | 0.294 |
| red sub-pixel | not used | 0.669 | 0.326 |
| | used | 0.669 | 0.326 |
| green sub-pixel | not used | 0.269 | 0.637 |
| | used | 0.269 | 0.637 |
| blue sub-pixel | not used | 0.138 | 0.068 |
| | used | 0.138 | 0.068 |

As shown in FIG. 5A, FIG. 5B and Table 1, when the color calibration layer absorbing light of a predetermined wavelength region is provided in the white sub-pixel (W), it is possible to display the substantially required color characteristic of white light, which is the color characteristic near color coordinates (0.28, 0.29).

In the light spectrum including no color calibration layer (FIG. 5A), there is a predetermined gap (d) between the light spectrum when passed through the green color filter in the green sub-pixel and the light spectrum of green wavelength region among white light in the white sub-pixel. On the other hand, in the light spectrum when using a color calibration layer (FIG. 5B), the gap (d) is reduced, and the required color characteristics of white light are displayed, since the color calibration layer 235 absorbs a part of the light in the green wavelength region.

Figure 6A:
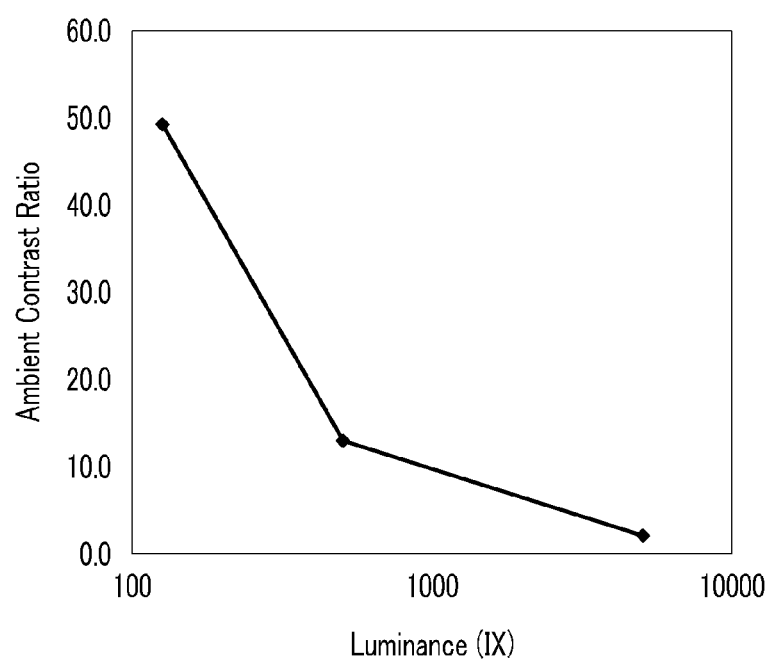
FIG. 6A is a graph illustrating contrast ratio as a function of the intensity of illumination of external light (luminance) when a color calibration layer is not applied to the white sub-pixel.
Figure 6B:
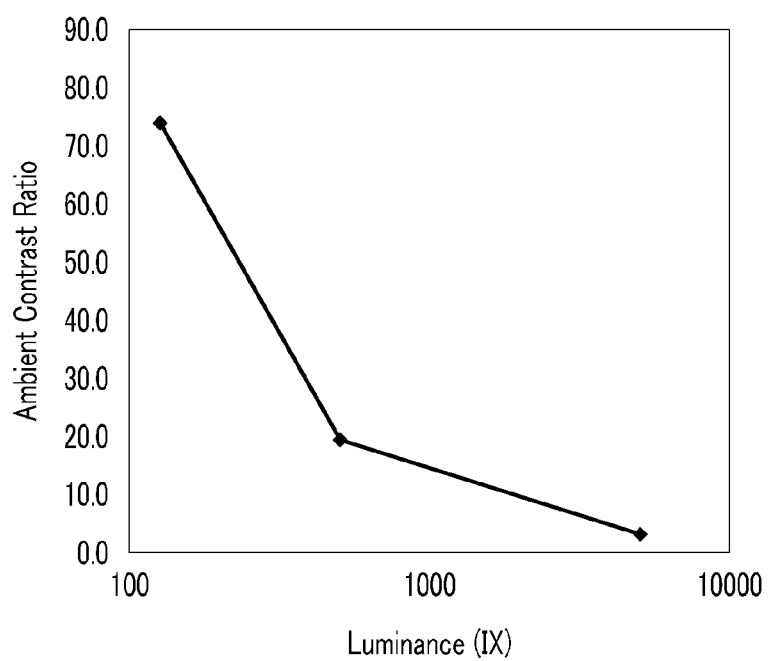
FIG. 6B is a graph illustrating contrast ratio as a function of the intensity of illumination of external light (luminance) when a color calibration layer absorbing light of a green wavelength region is applied to the white sub-pixel, according to an exemplary embodiment.

The contrast ratio characteristics are illustrated in FIG. 6A and FIG. 6B when the color calibration layer is applied in the organic light emitting diode device according to an exemplary embodiment.

FIG. 6A is a graph illustrating contrast ratio as a function of the intensity of illumination of external light (luminance) when a color calibration layer is not applied to the white sub-pixel. FIG. 6B is a graph illustrating contrast ratio as a function of the intensity of illumination of external light (luminance) when a color calibration layer absorbing light of a green wavelength region is applied to the white sub-pixel, according to an exemplary embodiment.

FIG. 6A and FIG. 6B illustrate that an exemplary embodiment of an organic light emitting diode device which uses a color calibration layer has higher ambient contrast ratio as a function of the intensity of illumination of external light than that of an organic light emitting diode device which does not use a color calibration layer.

The ambient contrast ratio drop due to the reflection of external light is mostly generated in the white sub-pixel (W), and the color calibration layer absorbs the light of green wavelength region, so the reflection of external light is reduced, thereby improving the ambient contrast ratio. The same effect may be seen when using a color calibration layer that absorbs the light of blue wavelength region or the light of red wavelength region.

It is thus possible to improve the contrast ratio without the use of an additional polarizer for reducing the light reflection by external light, whereby the use of a polarizer might generate some loss of light. Power consumption may also be improved.

While this disclosure has been described in connection with certain exemplary embodiments, it is to be understood that this disclosure is not limited to the disclosed embodiments, but, on the contrary, is intended to cover various modifications.

What is claimed is:

1. An organic light emitting diode device comprising:
a first sub-pixel, a second sub-pixel, and a third sub-pixel, each sub-pixel displaying a different color by passing white light having a white light spectrum through a color filter, said white light spectrum comprising a red wavelength region, a green wavelength region and a blue wavelength region, wherein the first sub-pixel includes a red color filter, the second sub-pixel includes a green color filter and the third sub-pixel includes a blue color filter, and wherein there is a predetermined gap between a light spectrum in at least one of the red, green or blue wavelength regions of the white light spectrum and a red, green or blue light spectrum, respectively, of light passed through the red, green or blue filter, respectively, in the first, second or third sub-pixel, respectively, and
a white sub-pixel, wherein only the white sub-pixel comprises a color calibration layer which selectively absorbs light of a green wavelength region, such that light emitted by the white sub-pixel after passing through the color calibration layer has a desired white color coordinates, and wherein the gap between the white light spectrum in the red, green or blue wavelength region and the respective red, green or blue light spectrum is reduced.

2. The organic light emitting diode device of claim 1, wherein the color calibration layer is disposed at the same layer as the red color filter, the green color filter, and the blue color filter.

3. The organic light emitting diode device of claim 1, wherein each of the first sub-pixel, the second sub-pixel, the third sub-pixel, and the white sub-pixel comprises:
a first electrode and a second electrode facing each other, and
an emission layer interposed between the first electrode and the second electrode.

4. The organic light emitting diode device of claim 1, wherein the emission layer comprises stacked structure of a red emission layer, a green emission layer, and a blue emission layer.

5. The organic light emitting diode device of claim 4, wherein the red emission layer, the green emission layer and the blue emission layer are vertically stacked.

6. The organic light emitting diode device of claim 4, wherein the red emission layer, the green emission layer and the blue emission layer are horizontally stacked.

7. The organic light emitting diode device of claim 3, wherein the emission layer further comprises a charge-generation layer.

8. An organic light emitting diode device comprising:
a red sub-pixel comprising a red color filter, a green sub-pixel comprising a green color filter, a blue sub-pixel comprising a blue color filter and a white sub-pixel, wherein the red, green and blue sub-pixels pass white light having a white light spectrum through the respective color filters, said white light spectrum comprising a red wavelength region, a green wavelength region and a blue wavelength region, wherein there is a predetermined gap between a light spectrum in at least one of the red, green or blue wavelength regions of the white light spectrum and a red, green or blue light spectrum, respectively, of light passed through the red, green or blue filter, respectively, in the red, green or blue sub-pixel, respectively, and wherein only the white sub-pixel comprises a color calibration layer which selectively absorbs light of a green wavelength region, such that light emitted by the white sub-pixel after passing through the color calibration layer has a desired white color coordinates, and wherein the gap between the white light spectrum in the red, green or blue wavelength region and the respective red, green or blue light spectrum is reduced, wherein each of the sub-pixels comprises:
  a first electrode and a second electrode facing each other, and
  an emission layer interposed between the first electrode and the second electrode, wherein the emission layer is disposed across the red, green, blue and white sub-pixels, and comprises:
    a plurality of sub-emission layers in a stacked structure, each sub-emission layer emitting light of a different wavelength; and
    a charge-generation layer;
  a thin film transistor array disposed under the emission layer;
  a lower insulating layer disposed on the thin film transistor array; and
  an upper insulating layer disposed on the lower insulating layer,
wherein the emission layer emits white light by combining the lights of different wavelengths emitted from the sub-emission layers and
wherein the red color filter, the green color filter, the blue color filter, and the color calibration layer are each disposed between the lower insulating layer and the upper insulating layer.

9. An organic light emitting diode device comprising:
a plurality of sub-pixels comprising a red sub-pixel, a green sub-pixel, a blue sub-pixel and a white sub-pixel, wherein each of the red, green and blue sub-pixels pass white light having a white light spectrum through a respective color filter, said white light spectrum comprising a red wavelength region, a green wavelength region and a blue wavelength region;
a lower layer comprising:
  a thin film transistor:
  a lower insulating layer disposed on the thin film transistor;
  a red color filter disposed on the lower insulating layer in the red sub-pixel;
  a green color filter disposed on the lower insulating layer in the green sub-pixel;
  a blue color filter on the lower insulating layer disposed in the blue sub-pixel, wherein there is a predetermined gap between a light spectrum in at least one of the red, green or blue wavelength regions of the white light spectrum and a red, green or blue light spectrum, respectively, of light passed through the red, green or blue filter, respectively, in the red, green or blue sub-pixel, respectively; and
  a color calibration layer disposed on the lower insulating layer in only the white sub-pixel, wherein the color calibration layer selectively absorbs light of a green wavelength region, such that light emitted by the white sub-pixel after passing through the color calibration layer has a desired white color coordinates, and wherein the gap between the white light spectrum in the red, green or blue wavelength region and the respective red, green or blue light spectrum is reduced,
an upper layer comprising a plurality of pixel electrodes and an upper insulating layer disposed on the red color filter, the green color filter, the blue color filter and the color calibration layer; and
an organic emission layer disposed across the red sub-pixel, the green sub-pixel, the blue sub-pixel, and the white sub-pixel, wherein the organic emission layer emits white light by combining lights of different wavelengths.

10. The organic light emitting diode device of claim 9, wherein the at least one light blocker is disposed between the blue color filter and the green color filter, or between the green color filter and the red color filter, or between the red color filter and the color calibration layer.

11. The organic light emitting diode device of claim 9, wherein the organic emission layer comprises a plurality of sub-emission layers in a stacked structure, each sub-emission layer emitting light of a different wavelength, and emits white light by combining the lights of different wavelengths emitted from the sub-emission layers.

12. The organic light emitting diode device of claim 9, wherein the red color filter, the green color filter, the blue color filter, and the color calibration layer are disposed on one layer.

13. The organic light emitting diode device of claim 1, wherein each of the first sub-pixel, the second sub-pixel, the third sub-pixel, and the white sub-pixel comprises:
an emission layer commonly disposed in the first sub-pixel, the second sub-pixel, the third sub-pixel, and the white sub-pixel, wherein the emission layer comprises a plurality of sub-emission layers emitting lights of different wavelengths, and emits white light by combining the lights of the different wavelengths emitted from the sub-emission layers,
a thin film transistor array disposed under the emission layer;
a lower insulating layer disposed on the thin film transistor array; and
an upper insulating layer disposed on the lower insulating layer,
wherein the red color filter, the green color filter, the blue color filter, and the color calibration layer are each disposed between the lower insulating layer and the upper insulating layer.

14. The organic light emitting diode device of claim 1, wherein the desired white color coordinates are (0.28, 0.29).

15. The organic light emitting diode device of claim 1, wherein the gap is between the green wavelength region of the white light spectrum and the green light spectrum of light passed through the green filter of the second sub-pixel.

* * * * *